United States Patent

Takahashi

[19]

[11] Patent Number: 6,069,076
[45] Date of Patent: May 30, 2000

[54] METHOD OF MAKING A SEMICONDUCTOR DEVICE WITH CHANGEABLE INTERCONNECTION

[75] Inventor: Yasuji Takahashi, Hamamatsu, Japan

[73] Assignee: Yamaha Corporation, Japan

[21] Appl. No.: 08/852,668

[22] Filed: May 7, 1997

[30] Foreign Application Priority Data

May 14, 1996 [JP] Japan ................................... 8-119307

[51] Int. Cl.$^7$ .................................................. H01L 21/44
[52] U.S. Cl. ..................... 438/660; 438/658; 438/662; 438/686; 438/687; 438/688; 438/659
[58] Field of Search .................................. 438/466, 611, 438/598, 660, 662, 632, 665, 658, 659, 686, 687, 688

[56] References Cited

U.S. PATENT DOCUMENTS 4,873,413 10/1989 Uesugi et al. ..................... 219/121.68
5,633,195 5/1997 Guthrie et al. ........................... 438/662
5,736,434 4/1998 Konuma et al. ......................... 438/151

FOREIGN PATENT DOCUMENTS 3-91944 4/1991 Japan .

*Primary Examiner*—David Nelms
*Assistant Examiner*—Reneé R. Berry

[57] ABSTRACT

A method of manufacturing a semiconductor device having the steps of: preparing a semiconductor device structure having an interconnection structure including a pair of electrically separated interconnections disposed near each other in one layer and a conductive pattern disposed near the pair of interconnections in the same layer; and applying light having a high intensity sufficient for melting and scattering conductive material of the conductive pattern to the conductive pattern and shorting the pair of interconnections with material formed by melting, scattering, and depositing the conductive material. This method provides a semiconductor device capable of easily connecting separated interconnections formed in the same layer.

20 Claims, 7 Drawing Sheets

800nm

METHOD OF MAKING A SEMICONDUCTOR DEVICE WITH CHANGEABLE INTERCONNECTION

This application is based upon Japanese Patent Application No. 8-119307 filed on May 14, 1996, the entire contents of which are incorporated herein by reference.

BACKGROUND OF THE INVENTION a) Field of the Invention

The present invention relates to a semiconductor device and its manufacture method, and more particularly to a semiconductor device and its manufacturing method capable of changing a wiring pattern once formed.

b) Description of the Related Art

Interconnections of a semiconductor device change in various ways depending upon circuit function of the device. if design of a semiconductor integrated circuit device starts after the circuit structure is decided, a turn-around time from a user order to final products becomes long.

Most of circuits in a semiconductor integrated circuit device have often the same fundamental structures. Therefore, if interconnections of a semiconductor device can be changed in various ways so as to satisfy the circuit function to be manufactured, the turn-around time of semiconductor devices can be shortened and considerable merits are given to both manufacturers and users.

Techniques for cutting an interconnection once formed are known, for example, cutting a fuse by flowing an excess current therethrough or applying an energy beam such as laser thereto.

For example, fine patterning with a focused ion beam (FIB) utilizes sputtering phenomenon which occurs when an ion beam is applied to the surface of a device in vacuum. By utilizing this phenomenon, an opening can be formed through a protective film on an interconnection and cut the interconnection.

It is also possible to connect electrically separated interconnections with a metal film which is formed by applying an ion beam while source gas is blown on the surface of the device in a vacuum chamber.

Another method is also known by which two superposed metal wiring layers separated by an insulating film are connected by applying a laser beam to the superposed area (Japanese Patent Laid-open Publication Hei 6-112321).

Of these techniques of connecting electrically separated two interconnections, the former technique requires a vacuum atmosphere and a supply of source gas to the device, and the latter technique requires forming two interconnections to be connected in two different layers.

In connecting electrically separated interconnections by the FIB method, it is necessary to form an opening, blow source gas, and radiate an ion beam, respectively in vacuum.

With the method described in Japanese Patent Laid-open Publication Hei 6-112321 for connecting superposed two metal wiring layers, even if interconnections can be formed in one layer, two-layer interconnections are required in order to form a superposed area to provide interconnection changeability.

SUMMARY OF THE INVENTION

It is an object of the present invention to provide a manufacture method of a semiconductor device capable of easily connecting separated interconnections formed in the same layer.

It is another object of the present invention to provide a semiconductor device capable of easily connecting separated interconnections formed in the same layer.

It is still another object of the present invention to provide a manufacture method of a semiconductor device capable of easily disconnecting one of interconnections and connecting two separated interconnections formed in the same layer.

It is still another object of the present invention to provide a semiconductor device capable of easily disconnecting one of interconnections and connecting two separated interconnections formed in the same layer.

According to one aspect of the present invention, there is provided a method of manufacturing a semiconductor device comprising the steps of: preparing a semiconductor device structure having an interconnection structure including a pair of electrically separated interconnections disposed near each other in one layer and a conductive pattern disposed near the pair of interconnections in the same layer; and applying light having a high intensity sufficient for melting and scattering conductive material of the conductive pattern to the conductive pattern and shorting the pair of interconnections with material formed by melting, scattering, and depositing the conductive material.

Light having a sufficiently strong intensity is applied to the conductive pattern formed near a pair of electrically separated interconnections to melt and scatter it. A deposit of scattered conductive material electrically connects the pair of separated interconnections.

If the conductive pattern to be scattered constitutes another interconnection electrically separated from the pair of interconnections, both cutting the another interconnection and connecting the pair of interconnections can be performed at the same time.

According to another aspect of the present invention, there is provided a semiconductor device having an interconnection structure, the interconnection structure comprising: plural pairs of interconnections formed in one layer, each pair of interconnections being disposed near each other; conductive deposit shorting a pair of interconnections among said pairs of interconnections, and a plurality of conductive patterns formed in the same one layer as the plural pairs of interconnections, each disposed near a corresponding one of the pairs of interconnections.

As above, a switch capable of changing its contact state can be realized by using the conductive pattern disposed in the same layer.

Depending upon the layout of electrodes, a switch capable of cutting one interconnection and connecting other interconnections can be realized. By using such a switch, semiconductor devices having various circuit structures can be formed.

DETAILED DESCRIPTION OF THE PREFERRED EMBODIMENTS

Embodiments of the present invention will be described with reference to the accompanying drawings.

FIGS. 1A to 1D are circuit diagrams and partial plan views illustrating an embodiment of the invention.

Figure 1A:
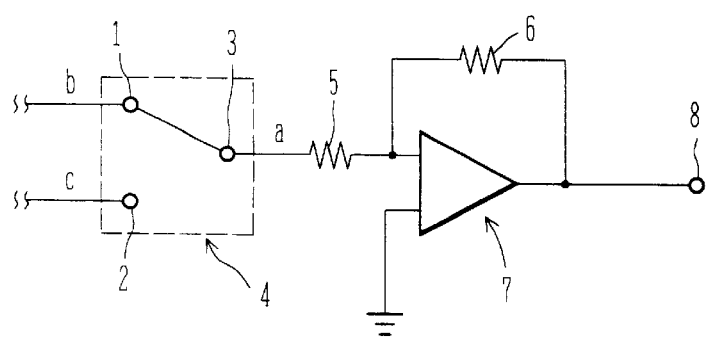
FIGS. 1A to 1D are circuit diagrams and schematic plan views illustrating an embodiment of the invention.

FIG. 1A is a circuit diagram before changing the connection state of interconnections. An output terminal 3 of a switch 4 is connected via an input resistor 5 to an input terminal of an operational amplifier 7. An output terminal 8 of the operational amplifier 7 is connected via a feedback resistor 6 also to the input terminal of the amplifier 7.

The switch 4 has two input terminals 1 and 2. An input signal b is applied to the input terminal 1 and an input signal c is applied to the input terminal 2. Tn the state shown in FIG. 1A, the output terminal 3 of the switch is connected to the input terminal 1. Therefore, the input signal b becomes a signal a supplied to the input terminal of the operational amplifier 7.

Figure 1B:
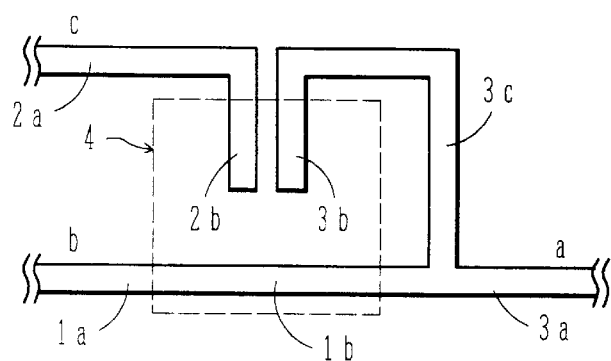

FIG. 1B shows a specific example of the structure of the switch 4 shown in FIG. 1A. An interconnection 1a extends in the lateral direction in FIG. 1B and is contiguous with an interconnection 3a. This state corresponds to a connection of the input terminal 1 of the switch shown in FIG. 1A to the output terminal 3. The other interconnection 2a extends in the lateral direction in FIG. 1B and is bent downward to form a work region 2b. An interconnection 3c branched from the interconnection 3a constituting the output terminal extends near the interconnection 2b and is bent downward to form another work region 3b parallel to the work region 2b.

A portion 1b of the interconnection 1a disposed inside of the switch 4 constitutes a work region of the interconnection 1a.

The circuit shown in FIGS. 1A and 1B has the input terminal connected to the output terminal 3 and the input terminal 2 disconnected from the output terminal 3. The connection state of this switch is changed so that the input terminal 1 is disconnected from the output terminal 3 and at the same time the input terminal 2 is connected to the output terminal 3.

Figure 1C:
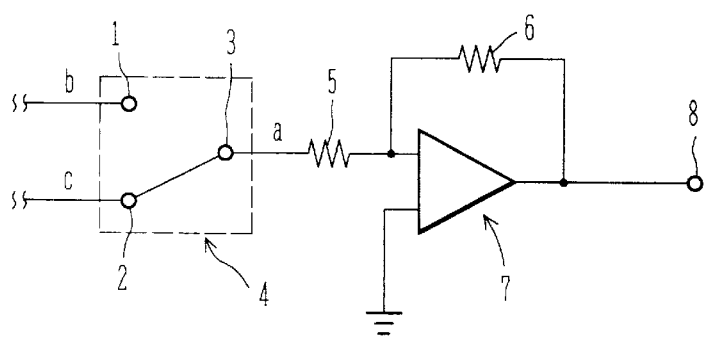

FIG. 1C is a circuit diagram after the connection state of interconnections is changed. In the switch 4, the input terminal 2 is connected to the output terminal 3 and the input terminal 1 is disconnected from the output terminal 3. The other structure is the same as FIG. 1A.

Figure 1D:
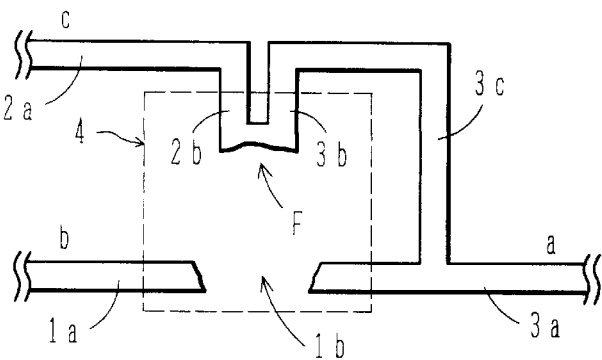

FIG. 1D shows an example of the structure of the switch 4 shown in FIG. 1C. In this switch 4, the work region 1b of the interconnection 1a is dissipated and the interconnections 1a and 3a are electrically disconnected. The work regions 2b and 3b of the interconnections 2a and 3c are connected together by a newly formed contact region F.

As above, the circuit structure can be changed by cutting one interconnection and connecting separated interconnections.

Figure 2:
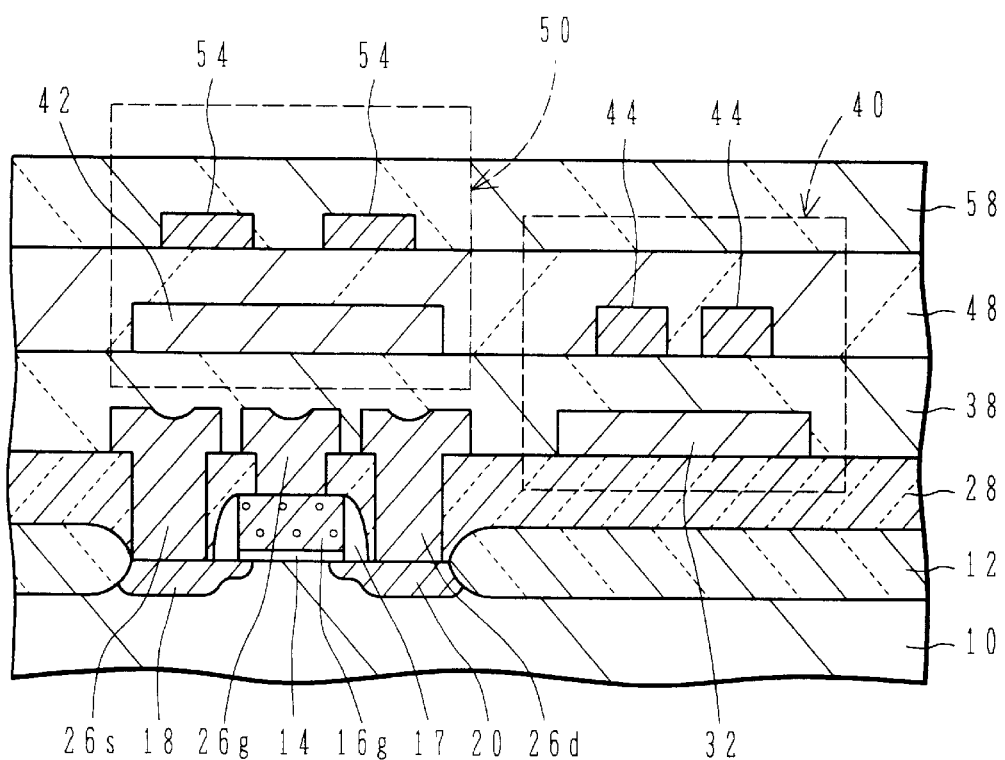
FIG. 2 is a schematic cross sectional view of a semiconductor device showing a switch such as shown in FIGS. 1A to 1D.

FIG. 2 is a cross sectional view showing an example of the structure of a semiconductor device having a switch such as shown in FIGS. 1A to 1D.

On the surface of a substrate 10 made of, for example, p-type Si, a pattern of a field oxide film 12 is formed by local oxidation of silicon (LOCOS) to define an active region. In this active region, a MOS transistor is formed. The operational amplifier shown in FIGS. 1A and 1C is formed by using such a MOS transistor.

On the surface of the active region, a thin gate oxide film 14 is formed through thermal oxidation. On this gate oxide film 14, a polycide gate electrode 16g is formed by patterning a laminated layer of lower polysilicon and upper silicide. The gate electrode may also be made of a single polysilicon layer.

Oxide spacers 17 are formed on the side walls of the gate electrode. Source/drain regions 18 and 20 of a lightly doped drain (LDD) structure are formed on both sides of the insulated gate electrode, through ion implantation using the insulated gate electrode and oxide spacers as a mask. The source/drain regions 18 and 20 are heavily doped to be $n^+$-type.

A first interlayer insulating film 28 is formed covering the gate electrode. Contact holes are formed in the first interlayer insulating film 28 to expose the source/drain regions 18 and 20 and gate electrode 16g of the MOS transistor.

Source/drain electrodes 26s and 26d and a gate wiring electrode 26g are formed embedding these contact holes. A dummy electrode pattern 32 is formed on the field oxide film 12, this pattern being made of the same material as the electrodes 26s, 26 d, and 26g. This electrode layer is called hereinafter a first metal layer.

A second interlayer insulating film 38 is formed covering the surface of the first metal layer. On the surface of the second interlayer insulating film 38, metal patterns 44 constituting work regions of a switch 40 at the same level. A dummy metal pattern 42 made of the same metal material is formed on the second interlayer insulating film at the left portion. This metal layer is called hereinafter a second metal layer.

A third interlayer insulating film 48 is formed covering the surface of the second metal layer. On the surface of the third interlayer insulating film 48, metal patterns 54 constituting work regions of a switch 50 are formed at the same level. This metal layer is called hereinafter a third metal layer. A passive film 58 is formed on the third metal layer.

In the structure shown in FIG. 2, although the switch 40 made of the second metal layer and the switch 50 made of the third metal layer are formed, desired wiring patterns may be formed at other regions of the substrate by using the same metal layers. Each switch has a dummy electrode pattern made of the underlying metal layer. The dummy wiring pattern can intercept a laser beam applied from the upper area and protects the underlying element structure and the like.

In the process of changing the connection state of a switch, both the switches 40 and 50 can be processed in the same manner. In the following description, although the switch 40 is used by way of example, the switch 50 can also be processed in the same manner.

Figure 3A:
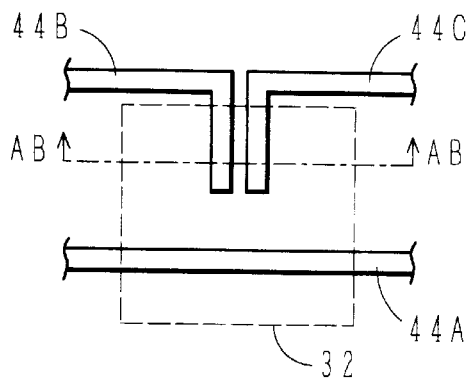
FIGS. 3AA to 3EB are plan views and cross sectional views illustrating the process of changing the connection state of the switch shown in FIGS. 1A to 1D and FIG. 2.
Figure 3A:
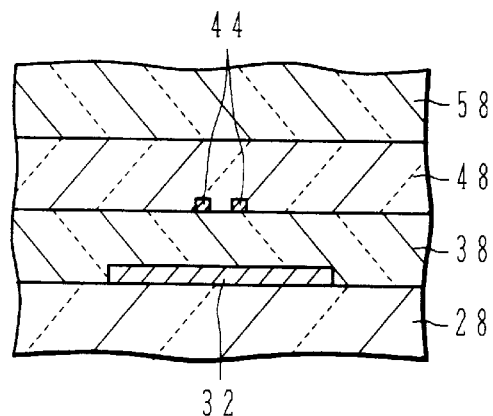

FIGS. 3AA to 3FB are schematic diagrams illustrating the process of changing the connection state of a switch, e.g., the switch 40.

FIGS. 3AA, 3BA, 3CA, 3DA, and 3EA are plan views of the switch, and FIGS. 3AB, 3BB, 3CB, 3DB, and 3EB are cross sectional views of the switch.

FIGS. 3AA and 3AB show the switch before its connection state is changed. Electrode patterns 44A, 44B, and 44C made of the second electrode layer are formed on the interlayer insulating film to be at the same level over the dummy electrode pattern 32. FIGS. 3AB is a cross sectional views taken along one-dot chain line AB—AB in FIG. 3AA. The dummy electrode pattern 32 is formed on the first interlayer insulating film 28 and covered with the second interlayer insulating film 38. The electrode pattern 44 formed on the second interlayer insulating film 38 is covered with the third interlayer insulating film 48 and a passivation film 58.

Figure 3B:
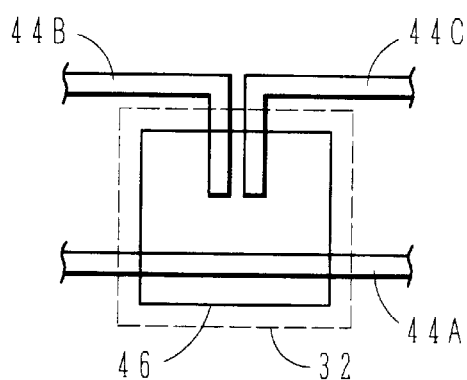
Figure 3B:
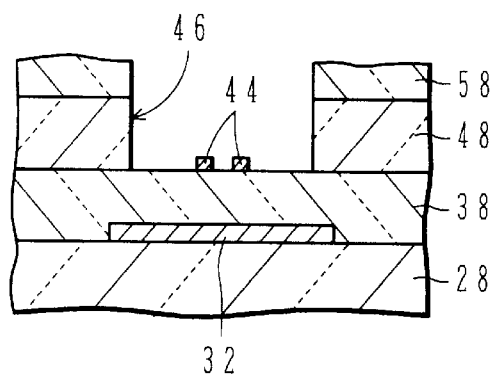

As shown in FIG. 3BB, an opening 46 is formed in the passivation film 58 and third interlayer insulating film 48 to expose the electrode pattern 44 of the switch.

As shown in FIG. 3BA, the opening 46 is preferably formed inside of the area of the dummy electrode pattern 32.

Figure 3C:
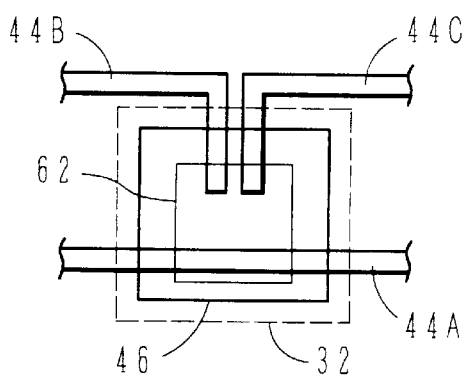
Figure 3C:
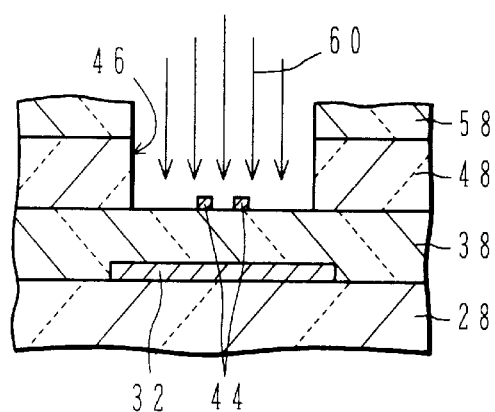

As shown in FIG. 3CB, a laser beam 60 is applied to the work region of the exposed electrode pattern 44. The wavelength and kind of the Laser beam are not particularly limited so long as they are sufficiently strong to allow the electrode pattern to be heated, melted, evaporated, and scattered or sputtered. For example, YAG (yttrium aluminum garnet) pulse type laser (oscillation wavelength of 800 nm, applied voltage: variable (maximum 970 V), variable beam), excimer laser, and the like may be used.

As shown in FIG. 3CA, an area 62 of laser beam radiation is set to cover a portion of an electrode 44A and work regions at the tip portions of electrodes 44B and 44C. Alternatively, the laser beam can be applied only on the electrodes so as not to directly impinge upon the interlayer insulating film or oxide film.

As the laser beam is applied, most of the metal pattern in the radiation area is melted, evaporated, and dissipated. At this time, the evaporated metal is sputtered to the nearby area.

Figure 3D:
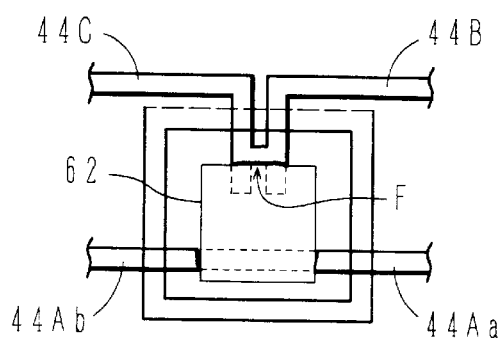
Figure 3D:
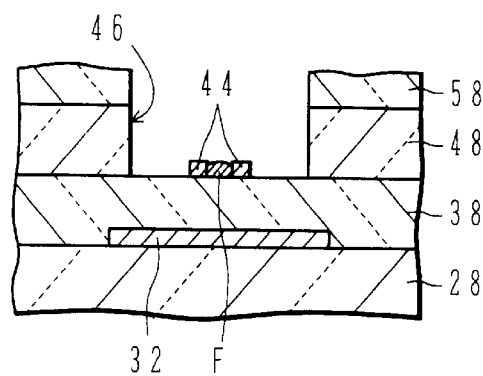

FIGS. 3DA and 3DB show an example of the structure of the switch after the laser beam is applied. As shown in FIG. 4DA, since the electrode in the radiation area 62 is melted and evaporated, the central area of the interconnection 44A is dissipated so that the interconnection 44A is changed to electrically separated two portions 44Aa and 44Ab. Furthermore, evaporated and scattered metal form a deposit F which electrically connects the electrodes 44B and 44C. In the above manner, while one interconnection is cut, the other separated interconnections are connected together to form a newly wired circuit.

The region to be evaporated and a region to be shorted are supposed preferably to be disposed near each other at the same level. For example, they may be disposed to be separated by only the minimum line width (rule) of patterning.

Figure 3E:
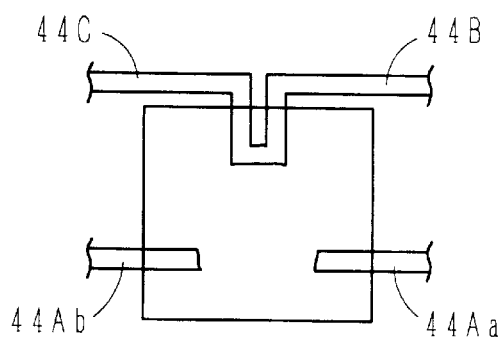
Figure 3E:
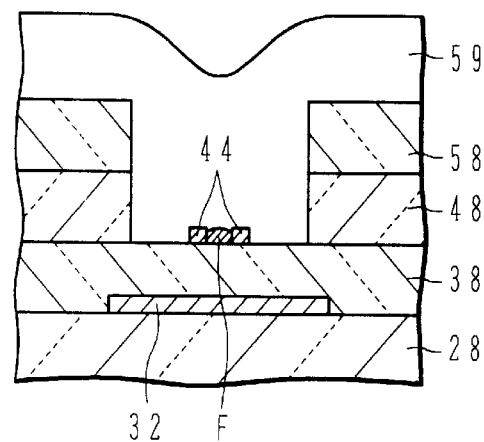

Thereafter, as shown in FIGS. 3EA and 3IB, a new passivation film 59 is formed covering the switch.

In order to provide sufficient selectivity in etching and exposing the work regions of the switch, an insulating film having different etching characteristics from those of the overlying interlayer insulating film may be formed on the surface of the underlying interlayer insulating film. For example, the interlayer insulating films 38 and 43 each may have a lamination structure of a silicon oxide film such as $SiO_2$, PSG, and BPSG and a silicon nitride film or silicon oxynitride film formed on the silicon oxide film.

A metal interconnection may be made of aluminum, aluminum alloy, copper, copper alloy, or the like. The metal interconnection may be made of the same layer as the metal layer used for other elements of a semiconductor integrated circuit.

Figure 4:
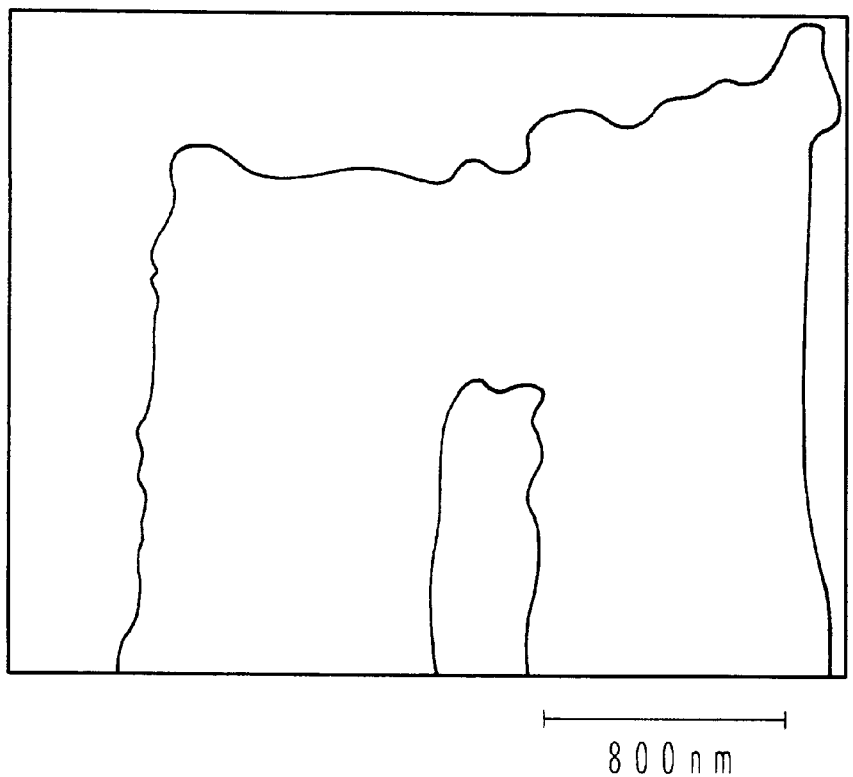
FIG. 4 is sketch of a microscopic picture showing a fine pattern formed on a sample substrate.

FIG. 4 is a sketch of a microscopic picture showing two parallel interconnections shorted by a metal deposit formed upon application of a laser beam. The width of the sample interconnection was about 800 nm and the used laser was YAG laser (applied voltage of 970 V).

In the above embodiment, although electrodes are disposed in parallel, various electrode patterns may be used which can efficiently short circuit interconnections with deposit of scattered metal.

Figure 5A:
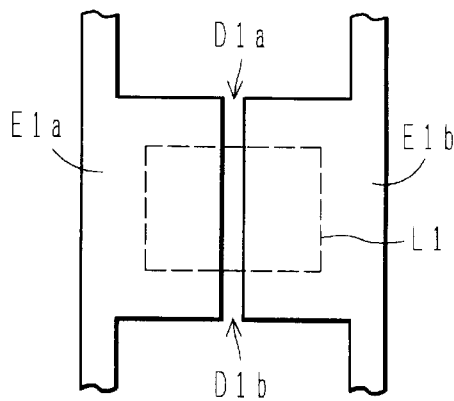
FIGS. 5AA to 5FB are plan views showing examples of an electrode structure of a switch.
Figure 5A:
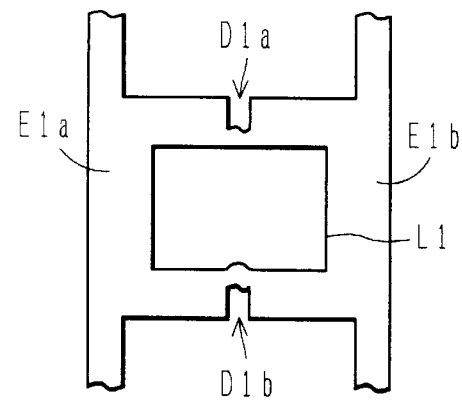

FIGS. 5AA to 5FB are plan views of electrode patterns. FIGS. 5AA, 5BA, ... , 5FA show patterns before the connection state is changed, and FIGS. 5AB, 5BB, ... , 5FB show patterns after the connection state was changed. In FIG. 5AA, electrodes E1a and E1b disposed in parallel in the vertical direction increase their widths toward each other at the area where the switch is formed, and face each other at gap portions D1a and D1b. The electrodes E1a and E1b are also disposed to be at the same level of wiring. For example, as a laser beam is applied to a radiation area L1, the electrodes E1a and E1b in this radiation area evaporate and scatter to the nearby area. As shown in FIG. 5AB, this scattered metal forms deposits which fill the gap portions D1a and D1b near the radiation area L1 and short the electrodes E1a and E1b.

Since almost the whole of the radiation area L1 is located within the electrodes E1a and E1b, it is possible to scatter more metal to the nearby area at the same level when the laser beam is applied and to thereby efficiently fill the gap portions. It is therefore possible to short electrodes with a high probability and with a low resistance.

The interconnection changing process with a laser beam can be performed in an ambient atmosphere. It is therefore considered that the phenomenon of scattering of metal from the radiation area to the nearby area is accompanied with air flow. There are supposedly metal components scattering radially from the central area of the radiation area. In this context, it is desired that the electrodes have as wide areas as possible along the direction from the central area of the radiation area toward the portion to be shorted, in order to fill the area near the radiation area with metal deposit.

Figure 5B:
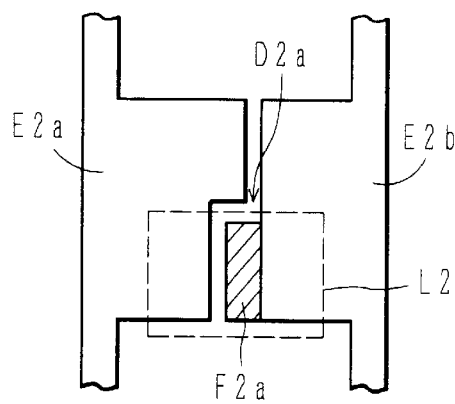
Figure 5B:
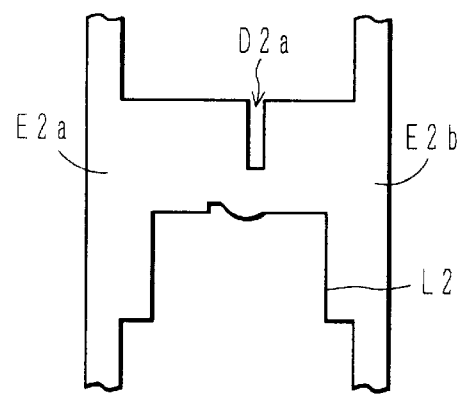

FIG. 5BA shows an example of the structure of electrodes E2a and E2b having a gap portion of a crank-like shape. For example, as a laser beam is applied to a radiation area L2, the electrodes E2a and E2b in this radiation area evaporate and scatter to the nearby area at the same level. As shown in FIG. 5BB, this scattered metal forms a deposit which fills the gap portion D2a near the radiation area L2 and shorts the electrodes E2a and E2b.

Since an electrode portion F2a is located in the radiation area disposed along the direction from the central area of the radiation area L2 toward the gap portion D2a, the gap portion D2a can be efficiently filled with metal deposit to short the electrodes E2a and E2b.

Figure 5C:
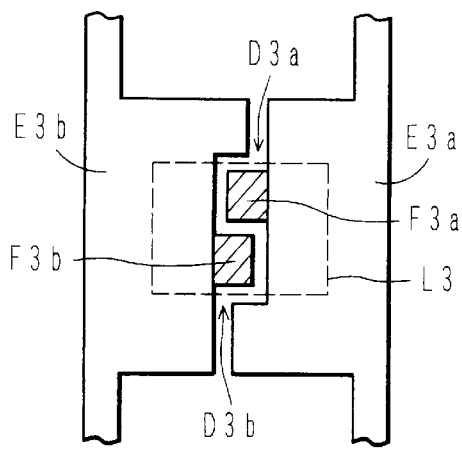
Figure 5C:
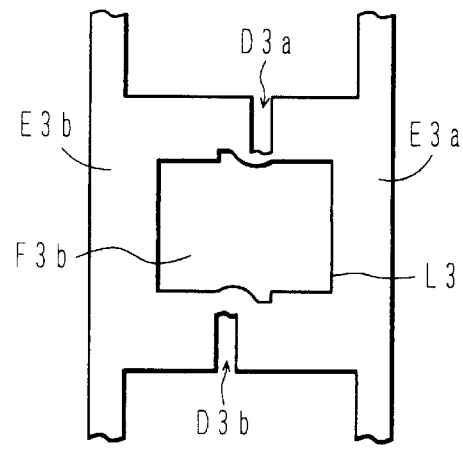

FIG. 5CA shows an example of the structure of electrodes in which the number of crank-shaped portions constituted of opposing portions of the electrodes is increased. The electrodes E3a and E3b confront each other and a gap portions provided with four bent areas (six bents if the outermost ones are also counted) are formed between the electrodes E3a and E3b. For example, as a laser beam is applied to a radiation area L3, the electrodes E3a and E3b in this radiation area evaporate and scatter to the nearby area at the same level. As shown in FIG. 5CB, this scattered metal forms deposits which fill the gap portions D3a and D3b rear the radiation area L3 and short the electrodes E3a and E3b.

Since the electrode portions F3a and F3b are located in radiation areas disposed along the direction from the central area of the radiation area L3 toward the gap portions D3a and D3b, the gap portions D3a and D3b can be efficiently filled with metal deposits to short the electrodes E3a and E3b.

Figure 5D:
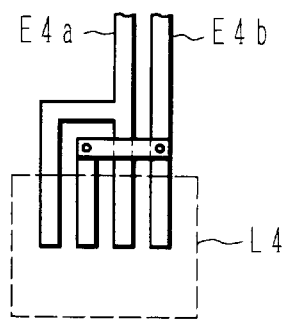
Figure 5D:
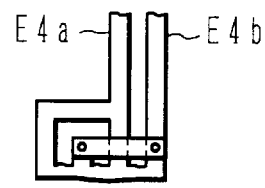

FIG. 5DA shows an example of the structure of electrodes to be shorted which are branched at the work region. The electrode E4a and E4b each are bifurcated at the work region so that four electrodes are disposed in parallel. As a laser beam is applied to a radiation area L4, the electrodes E4a and E4b in this radiation area evaporate and scatter to the nearby area at the same level. As shown in FIG. 5DB, this scattered metal forms deposits which short the electrodes E4a and E4b. With this structure, electrical short can be realized by any pair of two adjacent parallel electrodes.

Figure 5E:
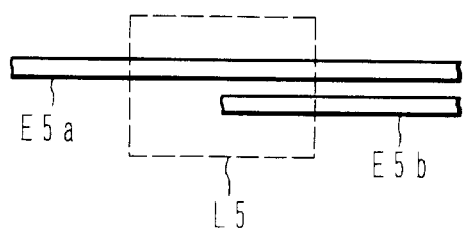
Figure 5E:

FIG. 5EA shows an example of the structure of electrodes in which both cutting an electrode and connecting electrodes are performed at the same time. An electrode E5a extends in the horizontal direction in FIG. 5EA. Another electrode E5b is disposed below the electrode E5a, in parallel with a small gap therebetween. As a laser beam is applied to a radiation area L5, the electrodes E5a and E5b in this radiation area evaporate and scatter to the nearby area at the same level. As shown in FIG. 5EB, the electrode E5a is cut, and the electrode remaining at the right side is connected to the lower electrode E5b.

Figure 5F:
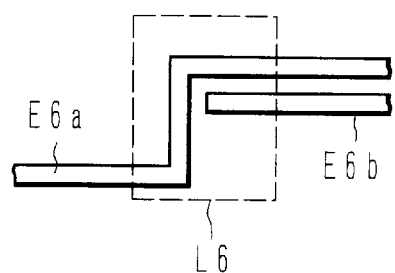
Figure 5F:

FIG. 5FA shows another example of the structure of electrodes in which both cutting an electrode and connecting electrodes are performed at the same time. An electrode E6a extends from the left to the right and has a crank portion at the intermediate area. An electrode E6b is disposed parallel to a right side portion of the electrode E6a near the crank portion. As a laser beam is applied to a radiation area L6, the electrodes E6a and E6b in this radiation area evaporate and scatter to the nearby area at the same level. As shown in FIG. 5FB, the right portion of the electrode E6a and the lower electrode E6b are shorted by scattered deposit.

The structures of the electrodes constituting the switch and the laser radiation areas are not limited to the above examples only. An electrode which is cut and not used for connecting to another electrode may be additionally used. The electrode material is not limited only to Al, Cu, and these alloys.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising the steps of:
    preparing a semiconductor device structure having an interconnection structure including a pair of electrically separated interconnections disposed near each other in one layer and a conductive pattern disposed near the pair of interconnections in the same layer; and
    applying light to the conductive pattern, the light having a high intensity sufficient for melting and scattering conductive material of the conductive pattern to melt, scatter and deposit the conductive material and thereby short the pair of interconnections with the deposited conductive material.

2. A method according to claim 1, wherein the pair of interconnections includes portions disposed at a gap.

3. A method according to claim 1, wherein the conductive pattern includes one portion of at least one of the pair of interconnections.

4. A method according to claim 3, wherein the one portion is wider than another portion.

5. A method according to claim 1, wherein the conductive pattern includes one portion of each of the pair or interconnections.

6. A method according to claim 5, wherein the one portion of each of the pair of interconnections is wider than another portion.

7. A method according to claim 5, wherein the gap has a portion of bent shape.

8. A method according to claim 7, wherein the gap has two or more portions of bent shape.

9. A method according to claim 1, wherein the conductive pattern has a branch.

10. A method according to claim 3, wherein in said shorting step, one of the pair of interconnections is cut and one portion of the cut interconnection is connected to the other of the pair of interconnections.

11. A method according to claim 1, wherein the conductive pattern includes another interconnection electrically separated from the pair of interconnections, and the other interconnection is cut by said shorting step.

12. A method according to claim 1, wherein said step of applying light and shorting the pair of interconnections is performed in an external ambient atmosphere or in an inert gas atmosphere.

13. A method according to claim 12, wherein the light is laser light.

14. A method according to claim 1, wherein said step of preparing a semiconductor device structure comprises the sub-steps of:
    forming a field oxide film on a silicon substrate to define an active region;
    forming an MOS transistor in the active region, the MOS transistor having a gate electrode and a pair of source/drain electrodes;
    forming an interlayer insulating film on the silicon substrate covering the MOS transistor; and
    forming said interconnection structure.

15. A method according to claim 14, wherein said step of preparing a semiconductor device structure further comprises the sub-steps of:
    forming a dummy electrode pattern on the field oxide film, said dummy electrode pattern being formed by the same process as that for forming said electrodes; and
    forming said pair of electrically separated interconnections and said conductive pattern on the interlayer insulating film at a location above said dummy electrode pattern.

16. A method according to claim 15, wherein said step of preparing a semiconductor device structure further comprises the sub-step of:
    forming an insulating film on the substrate covering the inter connections and the conductive pattern.

17. A method according to claim 16, further comprising the step of:
    partially removing said insulating film above the interconnections and the conductive pattern before the step of applying light.

18. A method according to claim 16, wherein said step of preparing a semiconductor device structure further comprises the sub-steps of:
    forming another dummy electrode pattern, on said inter layer insulating film, said another dummy electrode pattern being formed by the same process as that for forming said interconnections and said conductive pattern; and
    forming, on said insulating film, another pair of electrically separated interconnections disposed near each other in a single layer and another conductive pattern disposed near the another pair of interconnections in the same single layer.

19. A method according to claim 18, wherein said step of preparing a semiconductor device structure further comprises the sub-step of:

forming a passivation film on the substrate covering said another pair of interconnections and the said another conductive pattern.

20. A method according to claims 19, further comprising the step of:

before the step of applying light, partially removing said passivation film above said another pair of interconnections and said another conductive pattern.

* * * * *